United States Patent [19]

Chaib et al.

[11] Patent Number: 5,870,414
[45] Date of Patent: Feb. 9, 1999

[54] METHOD AND APPARATUS FOR ENCODING AND DECODING DIGITAL SIGNALS

[75] Inventors: Jean-Paul Chaib; Harry Leib, both of Montreal, Canada

[73] Assignee: McGill University, Montreal, Canada

[21] Appl. No.: 715,861

[22] Filed: Sep. 19, 1996

[51] Int. Cl.⁶ .......................... H03M 13/00; H03M 13/12
[52] U.S. Cl. .......................................... 371/43.4; 371/37.4
[58] Field of Search ................................. 371/43.4, 43.6, 371/43.7; 375/265, 262, 341

[56] References Cited

U.S. PATENT DOCUMENTS

| | | | |
|---|---|---|---|
| 4,295,218 | 10/1981 | Tanner | 371/40 |
| 4,761,778 | 8/1988 | Hui | 370/46 |
| 4,939,555 | 7/1990 | Calderbank et al. | 375/17 |
| 5,142,539 | 8/1992 | Dahlin et al. | 371/37.1 |
| 5,151,919 | 9/1992 | Dent | 375/1 |
| 5,218,619 | 6/1993 | Dent | 375/1 |
| 5,230,003 | 7/1993 | Dent et al. | 371/43 |
| 5,321,725 | 6/1994 | Paik et al. | 375/39 |
| 5,353,352 | 10/1994 | Dent et al. | 380/37 |
| 5,651,032 | 7/1997 | Okita | 375/341 |
| 5,742,678 | 4/1998 | Dent et al. | 380/6 |

OTHER PUBLICATIONS

*Channel Coding with Multilevel/Phase Signals*, Gottfried Ungerboeck, IEEE Transactions on Information Theory, vol. It–28, No. 1, Jan. 1982.

*Comparison of Very Low Rate Coding Methods for CDMA Radio Communications System*, Kari Rikkinen, third International Symposium on Spread–Spectrum Techniques and Applications, University of Oulu, Oulu, Finland Jul. 1994.

*Very Low Rate Convolutional Codes for Maximum Theoretical Performance of Spread–Spectrum Multiple–Access Channels*, Andrew J. Viterbi, IEEE Journal on Selected Areas in Communications, vol. 8, No. 4, pp. 641–649 May 1990.

*A Class of Low–Rate Nonlinear Binary Codes*, A.M Kerdock, Low–Rate Nonlinear Binary Codes, Information and Control 20, 182–187 (1972), Academic Press, Inc.

*Throughput Analysis for Code Division Multiple Accessing of the Spread Spectrum Channel*, Joseph Y.N. Hui, IEEE Journal on Selected Areas in Communications, vol. SAC–2, No. 4, Jul. 1984 pp. 482–486.

(List continued on next page.)

*Primary Examiner*—Stephen M. Baker
*Attorney, Agent, or Firm*—Tom Adams

[57] ABSTRACT

A method of encoding a digital signal comprising a sequence of digital words, each comprising a first portion and a second portion, comprises the steps of successively encoding respective first portions using a trellis code to produce a corresponding sequence of trellis-encoded words, using each of the trellis-coded words to select one of a plurality of subcodes of a block code, and using the selected subcode to encode the corresponding second portion of the digital word corresponding sequentially to the trellis-coded word used to select the subcode, thereby providing a sequence of codewords corresponding to the sequence of digital words. After transmission and/or storage, a sequence of codeword vectors comprising the codewords and noise may be decoded by operating upon each of the sequence of codeword vectors using a decoder for each of the subcodes to produce, for each subcode, an estimated decoded second portion and a metric representing the likelihood that the estimated decoded second portion is correct, given that the assumed subcode is correct; using a trellis decoder, operating upon the sequence of likelihood metrics and the associated estimated second portions to provide a sequence of estimated first portions; and associating with each of the estimated first portions the corresponding estimated second portion, thereby providing a sequence of output digital words corresponding to the sequence of digital words originally encoded. The block code may comprise a Kerdock code, the subcodes being cosets of the Reed-Muller code. The decoder may then comprise a Fast Hadamard Transform unit and a Viterbi algorithm decoder.

26 Claims, 5 Drawing Sheets

OTHER PUBLICATIONS

*Spread Spectrum Communications—Myths and Realities*, Andrew J. Viterbi IEEE Communications Magazine, May 17, 1979 pp. 11–18.

*On New Classes of Orthogonal Convolutional Codes; Communications, Control and Signal Processing*, E. Zehavi and A.J. Viterbi, Elsevier Science Publishers,1990, pp. 257–263.

*A Comparison of Trellis–Coded Versus Convolutionally –Coded Spread Spectrum Multiple–Access Systems*, G.D. Boudreau et al, IEEE Journal on Selected Areas in Communications vol. 8, No. 4, 1990.

*Qualcomm's Interim Standard (IS 95)* (Proposed EIA/TIA Wideband Spread Spectrum) pp. 6–8 to 6–20.

*Combined Trellis/Reed–Muller Coding for CDMA*. J.P. Chaib and H Leib, Sixth IEEE Symposium on Personal Indoor and Mobile Radio Communications (PIMRC 95) Toronto, Canada Sep. 1995, pp. 243–247.

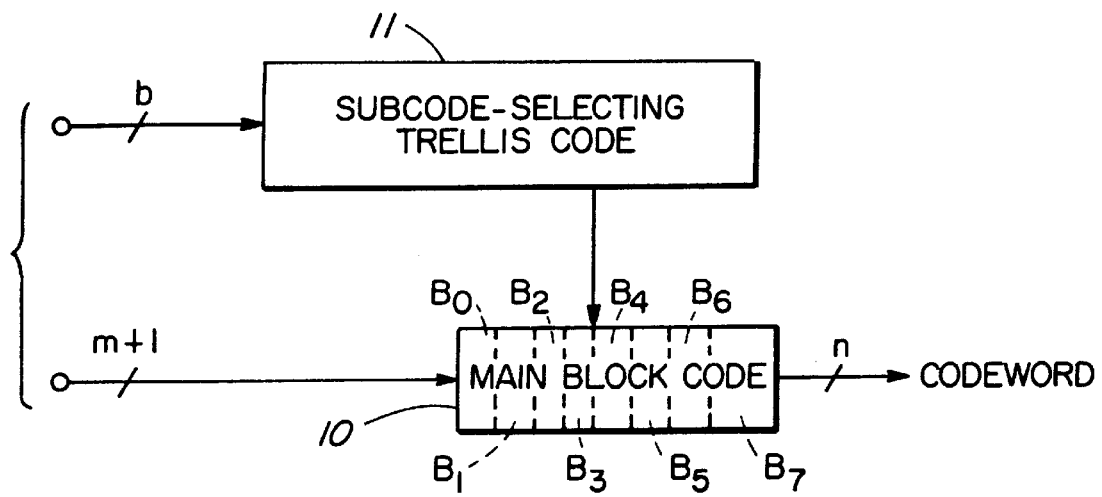
FIG. 1
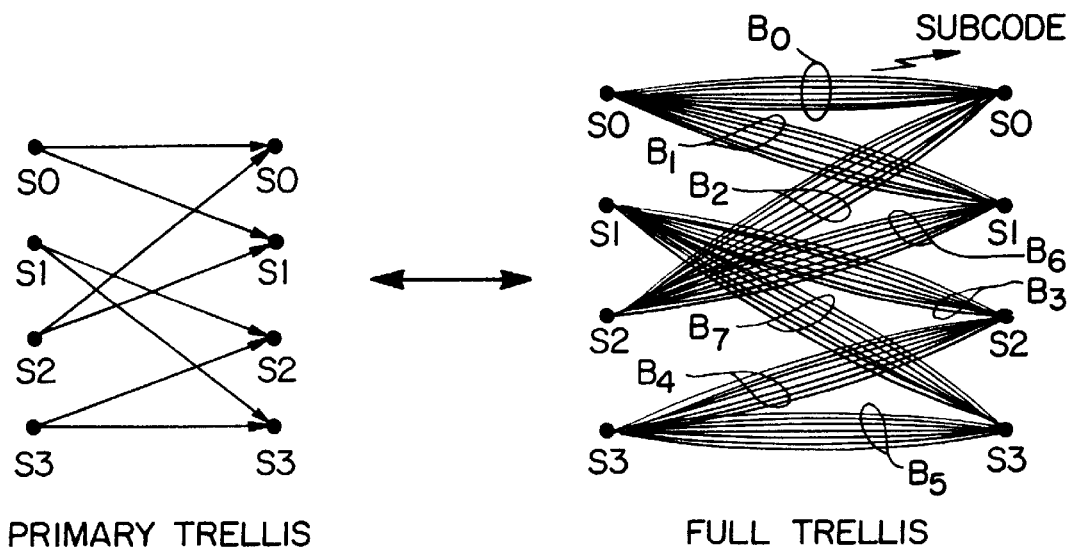
PRIMARY TRELLIS
FIG. 2A
FULL TRELLIS
FIG. 2B

BRANCH METRIC COMPUTER FOR MAXIMUM-LIKELIHOOD DECODING OF TRM CODES.

METHOD AND APPARATUS FOR ENCODING AND DECODING DIGITAL SIGNALS

BACKGROUND OF THE INVENTION

TECHNICAL FIELD

The invention relates to a method and apparatus for encoding and decoding digital signals. The invention is especially, but not exclusively, applicable to communications systems which employ spread spectrum techniques, such as direct-sequence, code-division multiple access (DS-CDMA) communications systems and the like.

BACKGROUND ART

One reason for using spread-spectrum techniques in digital communications systems is to reduce interference. In direct-sequence, code-division multiple access systems (DS-CDMA) where the same spectrum is shared by signals of multiple users, each using a unique code, the interference is mainly due to signals of other users. The number of users that can be accomodated is limited by the desired grade of service. Improving the reliability of data transmission in such systems allows the system capacity to be increased.

Early spread-spectrum systems used pseudo-random number sequences to expand the bandwidth occupied by the particular user's signal, but it is now recognised that improved system performance can be obtained by using error control coding for both signal spreading and error control. It has been proposed to use for this purpose very low rate codes based upon the combination of convolutional and block codes. A convolutional code provides an output symbol sequence that can be expressed as the convolutions of the input bit sequence with the code generators. A convolutional encoder thus provides output sums which are moving weighted sums of the information sequence encoded. Various examples have been disclosed. Thus, A. J. Viterbi described the application of so-called orthogonal convolutional codes to spread spectrum in an article entitled "Very Low Rate Convolutional Codes for Maximum Theoretical Performance of Spread-Spectrum Multiple-Access Channels", IEEE Journal on Selected Areas in Communications, Volume 8, No. 4, pp 641–649, May 1990. K. Rikkinen disclosed biorthogonal convolutional coding for a DS-CDMA radio communications system in an article entitled "Comparison of Very Low Rate Coding Methods for CDMA Radio Communications System", Third International Symposium on Spread-Spectrum Techniques and Applications, University of Oulu, Oulu, Finland, July 1994. A "super-orthogonal" convolutional code was disclosed by E. Zehavi and A. J. Viterbi in "On New Classes of Orthogonal convolutional Codes", Communications, Control and Signal Processing, Elsevier Science Publishers, 1990. These codes are based upon the concatenation of a linear convolutional code with a Hadamard Code or a first order Reed-Muller code. An error control code specified in Qualcomm's Interim Standard (IS 95) (Proposed EIA/TIA Wideband Spread Spectrum) consists essentially of the combination of a convolutional code of constraint length 9 and rate ⅓ with a Hadamard code.

In an article entitled "Channel Coding with Multi-Level/Phase signals", IEEE Transactions on Information Theory, Volume IT-28, No. 1, January 1982, G. Ungerboeck proposed using a trellis code to select different subsets of a large signal constellation and mentioned the possibility of assigning short block code words to state transitions in a trellis structure. Although Ungerboeck's coding scheme might be satisfactory in some situations, it is not entirely satisfactory where bandwidth expansion is involved, such as in spread-spectrum systems. As reported by G. D. Boudreau et al in "A Comparison of Trellis-Coded Versus Convolutionally-Coded Spread Spectrum Multiple-Access Systems" IEEE Journal on Selected Areas in Communications Vol. 8, No. 4, 1990, low rate codes would usually give better performance in CDMA systems.

Although these previously-proposed coding schemes might provide better performance than early systems, especially those using pseudo random number sequences, there is still room for improvement.

An object of the present invention is to provide an improved method and apparatus for encoding/decoding digital signals which, as compared with known coding schemes for CDMA systems, gives improved reliability and bit error rates for a given signal-to-noise ratio or, conversely, reduced required signal-to-noise ratio to achieve a given bit error rate.

SUMMARY OF THE INVENTION

According to one aspect of the present invention, there is provided a method of encoding a digital signal comprising a sequence of digital words, each comprising a first portion and a second portion, to provide a corresponding sequence of codewords, supplying the sequence of codewords to a transmission or storage medium, extracting a corresponding sequence of codeword vectors from the transmission or storage medium, and decoding the sequence of codeword vectors to extract the originally-encoded sequence of digital words;

the encoding comprising the sequential steps of:

using a trellis code, successively encoding respective first portions of the sequence of digital words to produce a corresponding sequence of trellis-encoded words, each of the trellis-encoded words corresponding, in the sequence, to one of the digital words;

and encoding each second portion of the digital words using one of a plurality of subcodes of a block code, each subcode comprising a coset of a Reed Muller code, the coset used for a particular second portion being determined by the trellis-encoded word obtained by encoding the corresponding first portion;

the decoding comprising the steps of;

operating upon each of the codeword vectors using a decoder for each of the subcodes to produce, for each subcode, an estimated decoded second portion and a metric representing the likelihood that the estimated decoded second portion is correct, given that the assumed subcode is correct;

using a trellis decoder, operating upon the sequence of likelihood metrics and the associated estimated second portions to provide a sequence of estimated first portions;

and associating with each of the estimated first portions the corresponding estimated second portion thereby providing a sequence of output digital words corresponding to the sequence of digital words originally encoded.

According to a second aspect of the present invention, a method of encoding a digital signal comprising a sequence of digital words, each comprising a first portion and a second portion, to provide a corresponding sequence of codewords, comprises the sequential steps of:

using a trellis code, successively encoding respective first portions of the sequence of digital words to produce a corresponding sequence of trellis-encoded words, each of the trellis-encoded words corresponding, in the sequence, to one of the digital words;
and encoding each second portion of the digital words using one of a plurality of subcodes of a block code, each subcode comprising a coset of a Reed-Muller code, the coset used for a particular second portion being determined by the trellis-encoded word obtained by encoding the corresponding first portion.

According to a third aspect of the invention, there is provided a method of decoding a sequence of codeword vectors formed by encoding a sequence of digital words in accordance with the method of the above-mentioned first aspect, comprising the steps of;

operating upon each of the codeword vectors using a decoder for each of the subcodes to produce, for each subcode, an estimated decoded second portion and a metric representing the likelihood that the estimated decoded second portion is correct, given that the assumed subcode is correct;

using a trellis decoder, operating upon the sequence of likelihood metrics and the associated estimated second portions to provide a sequence of estimated first portions; and associating with each of the estimated first portions the corresponding estimated second portion thereby providing a sequence of output digital words corresponding to the sequence of digital words originally encoded wherein the step of operating upon each of the codeword vectors includes the steps of applying each coset leader to each codeword vector, and performing a Fast Hadamard Transform upon the resulting vector, and the step of operating upon the sequence of likelihood metrics and associated estimated second portions comprises applying a Viterbi algorithm thereto.

According to a fourth aspect of the invention, there is provided apparatus for encoding a digital signal comprising a sequence of digital words, each comprising a first portion and a second portion, to provide a corresponding sequence of codewords, supplying the sequence of codewords to a transmission or storage medium, extracting a corresponding sequence of codeword vectors from the transmission or storage medium, and decoding the sequence of codeword vectors to extract the originally-encoded sequence of digital words;

the apparatus comprising an encoder comprising:

a trellis code unit for successively encoding respective first portions of the sequence of digital words to produce a corresponding sequence of trellis-encoded words, each of the trellis-encoded words corresponding, in the sequence, to one of the digital words;

a block code unit for encoding respective second portions of the digital words to provide codewords from the selected ones of subcodes of the block code, each subcode comprising a coset of a Reed-Muller code, the coset used for a particular second portion being determined by the trellis-encoded word obtained by encoding the corresponding first portion the apparatus further comprising a decoding unit comprising;

means for operating upon each of the sequence of codeword vectors using a decoder for each of the subcodes to produce, for each subcode, an estimated decoded second portion and a metric representing the likelihood that the estimated decoded second portion is correct, given that the assumed subcode is correct;

a trellis decoder unit having means for operating upon the sequence of likelihood metrics and the associated estimated second portions to provide a sequence of estimated first portions;
and means for associating with each of the estimated first portions the corresponding estimated second portion thereby to provide a sequence of output digital words corresponding to the sequence of digital words originally encoded.

According to a fifth aspect of the invention, there is provided apparatus for encoding a digital signal comprising a sequence of digital words, each comprising a first portion and a second portion, to provide a corresponding sequence of codewords, comprising:

a trellis code unit for successively encoding respective first portions of the sequence of digital words to produce a corresponding sequence of trellis-encoded words, each of the trellis-encoded words corresponding, in the sequence, to one of the digital words and;

a block code unit for encoding respective second portions of the digital words to provide codewords from the selected ones of subcodes of the block code, the block code unit using one of a plurality of subcodes of a block code, each subcode comprising a coset of a Reed-Muller code, the coset used for a particular second portion being determined by the trellis encoded word obtained by encoding the corresponding first portion.

According to a sixth aspect of the invention, there is provided a decoder for decoding codeword vectors provided by the apparatus of the above-mentioned fifth aspect, the decoder comprising:

means for operating upon each of the codeword vectors using a decoder for each of the subcodes to produce, for each subcode, an estimated decoded second portion and a metric representing the likelihood that the estimated decoded second portion is correct, given that the assumed subcode is correct;

a trellis decoder unit having means for operating upon the sequence of likelihood metrics and the associated estimated second portions to provide a sequence of estimated first portions;
and means for associating with each of the estimated first portions the corresponding estimated second portion thereby to provide a sequence of output digital words corresponding to the sequence of digital words originally encoded wherein the means for operating upon each of the sequence of codeword vectors comprises means for combining with each codeword vector each of the coset leaders, Fast Hadamard Transform means for operating upon the vectors resulting from such combination to produce said estimated decoded second portion and said metric, and said trellis decoder unit uses a Viterbi algorithm.

In the context of this specification, a trellis code is a code whose output is dependent upon its current input and a fixed finite number of past inputs. Such a trellis code may be a convolutional code, the dependency being linear (a weighted sum).

Preferably, the subcodes are all cosets of each other, the coded words then corresponding to coset leaders.

In a preferred embodiment, the block code comprises a Kerdock code partitioned into cosets including a first-order Reed-Muller code. Then, the second portion of the digital word is encoded using a Reed-Muller encoder and the coset leader is added to the Reed-Muller encoded word to provide the codeword.

Various features, objects and advantages of the present invention will become more apparent from the following detailed description of embodiments of the invention which are described by way of example only and with reference to the accompanying drawings.

BRIEF DESCRIPTION OF THE DRAWINGS

FIG. 1 illustrates the concept of the present invention as applied to the encoding of a sequence of digital words using a trellis code and selected subcodes of a large block code;

FIGS. 2A and 2B represent trellis structures for the trellis code per se and for the encoder itself;

DESCRIPTION OF THE PREFERRED EMBODIMENTS

Figure 3:
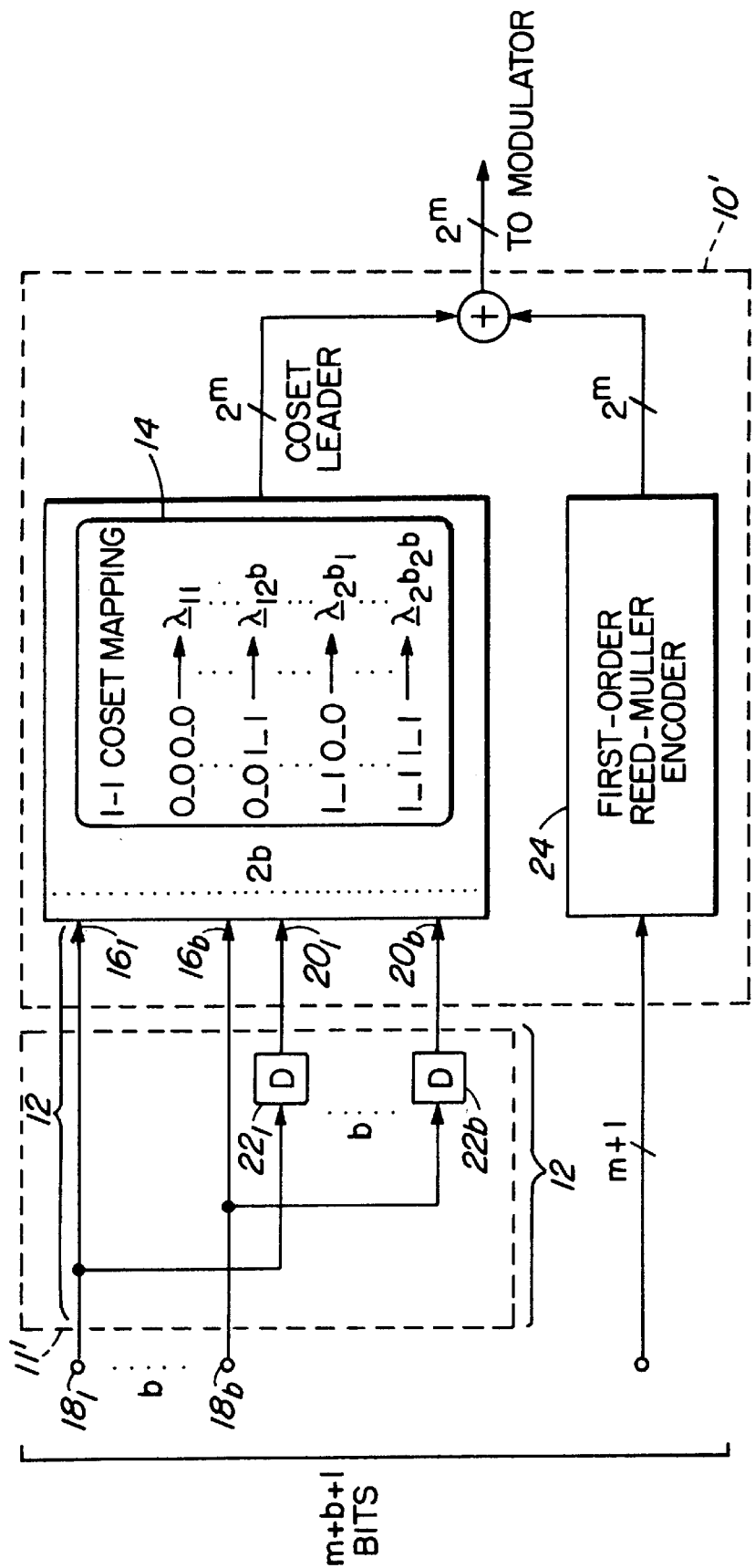
FIG. 3 is a block schematic representation of a first embodiment of an encoder according to the invention.

Referring now to FIG. 1, an encoder for encoding digital words, each comprising a first portion having b-bits and a second portion having m+1 bits, comprises a block code unit 10 for generating codewords of a low-rate block code. The low-rate block code is partitioned into subcodes $B_0$ to $B_7$, each subcode comprising a plurality of n-bit codewords. Although eight subcodes $B_0$ to $B_7$ are illustrated in FIG. 1, this is an arbitrary number for illustration only. The encoder also comprises a subcode-selecting trellis code unit 11, the possible outputs of which select the subcodes $B_0$–$B_7$. The subcode-selecting trellis code unit 11 has a constraint length K. The first group of b bits of each digital word in the series are applied to the subcode-selecting trellis code unit 11, which encodes them to produce a corresponding series of trellis-encoded words. Each of the trellis-encoded words selects a corresponding one of the subcodes $B_0$–$B_7$ of the block code, which is used to encode the remaining m+1 bits of the same digital word to provide an n-bit codeword for output from the encoder. Thus, each second portion of m+1 bits is applied to the block encoder 10 to select one of the codewords of the selected one of the subcodes $B_0$–$B_7$. In the specific embodiments to be described with reference to FIGS. 2–5, n is much larger than both b and m. The overall code rate is $$\frac{m+b+1}{n}$$

and is independent of the constraint length K of the trellis code.

Referring now to FIGS. 2A and 2B, the trellis structure of the encoder of FIG. 1, shown in FIG. 2B, can be derived by replacing each of the branches of the primary trellis structure of subcode-selecting trellis code unit 11, shown in FIG. 2A, by a set of parallel branches, each representing one of the codewords of the corresponding one of the subcodes $B_0$ to $B_7$. Although FIG. 2B shows a different subcode between each state transition, in practice it would be possible to have the same subcode between two different state transitions. For purposes of illustration, FIG. 2 shows eight parallel branches for each state transition.

Two practical embodiments of the encoder will now be described, one designed for simple construction and the other for better performance. Both use a trellis code which comprises a convolutional code and a large block code which comprises a so-called Kerdock code as disclosed by A. M. Kerdock in an article entitled "A Class of Low-Rate Nonlinear Binary Codes," *Information and Control*, Vol. 20, pp 182–187 (1972). The Kerdock code is a non-linear binary block code with $2^{2m}$ codewords, each of length $2^m$. Its minimum Hamming distance is $$2^{m-1} - 2^{\frac{m}{2} - 1}.$$

It can also be viewed as the union of the first-order Reed-Muller code (of size $2^{m+1}$) and $2^{m-1}-1$ of its cosets. The coset leaders are bent functions with the added property that the sum of any two coset leaders is again a bent function.

Thus, in the following embodiments, the subcodes are the first-order Reed-Muller cosets in the Kerdock code and the convolutional code generates coset leaders which, when combined with the outputs of the Reed-Muller encoder, give the required codewords.

The trellis code is designed to ensure that the free distance of the overall code is greater than or equal to the minimum Hamming distance of the coset codes. The Kerdock code has a minimum Hamming distance $$d_{block} = 2^{m-1} - 2^{\frac{m}{2} - 1}$$

and the Reed-Muller code has a minimum Hamming distance $$d_{subcode} = 2^{m-1},$$

it follows that the coset-selecting trellis code must have a modified free distance $$d_{mf} \geq 2$$

The modified free distance $d_{mf}$ of the code is the minimum modified distance between any two distinct paths in its primary trellis. The modified distance between any two branches $\beta_1$ and $\beta_2$ in the primary trellis having corresponding coset leaders $\underline{\lambda}_1$ and $\underline{\lambda}_2$ is defined as $$d_m(\beta_1, \beta_2) = \begin{cases} 0 & \text{if } \underline{\lambda}_1 = \underline{\lambda}_2 \\ 1 & \text{if } \underline{\lambda}_1 \neq \underline{\lambda}_2 \end{cases}$$

If the minimum Hamming distance of the block code is $d_{block}$ and the minimum Hamming distance of the subcode is $d_{subcode}$, then the free distance of the encoder is $$d_{free} = \min\{d_{subcode}, d_{block} \times d_{mf}\}$$

The minimum Hamming distance of the coset codes depends upon the partitioning of the large block code whereas $d_{mf}$ depends upon the coset-selecting trellis code. The objective is to partition the block code such that $d_{subcode} > d_{block}$ and use a coset-selecting code such that $d_{mf} \times d_{block} \geq d_{subcode}$. The asymptotic coding gain of the resulting encoder over the block code is improved by the ratio of $d_{free}/d_{block}$. For more details, the reader is directed to the article "Combined Trellis/Reed-Muller Coding for CDMA", J. P. Chaib, H. Leib, Proceedings of the Sixth International Symposium on Personal, Indoors and Mobile Radio Communications, Toronto, Canada, 1995, which is incorporated herein by reference.

The following general rules can be used to construct good coset-selecting trellis codes with b inputs:

1. All coset leaders should occur with the same frequency, so that if all data sequences are equally likely, then all codewords are generated with equal probability.

2. The modified free distance must satisfy $d_{mf} \geq d_{subcode}/d_{block}$.

3. Non-catastrophicity. The primary encoder trellis must not contain any two infinite paths with a finite number of different coset leaders, but generated from input bit sequences with an infinite Hamming distance between them.

Since $d_{free} \leq d_{subcode}$, the performance of the encoder is limited by that of the subcodes that are used, at least for high signal-to-noise ratios. Hence, there is little to be gained by using very powerful trellis codes, i.e. with $d_{mf} \geq d_{subcode}/d_{block}$.

An important consequence of rule (2) is that the number of delay elements needed to implement a good b-input coset-selecting trellis code is at least equal to b.

Figure 4:
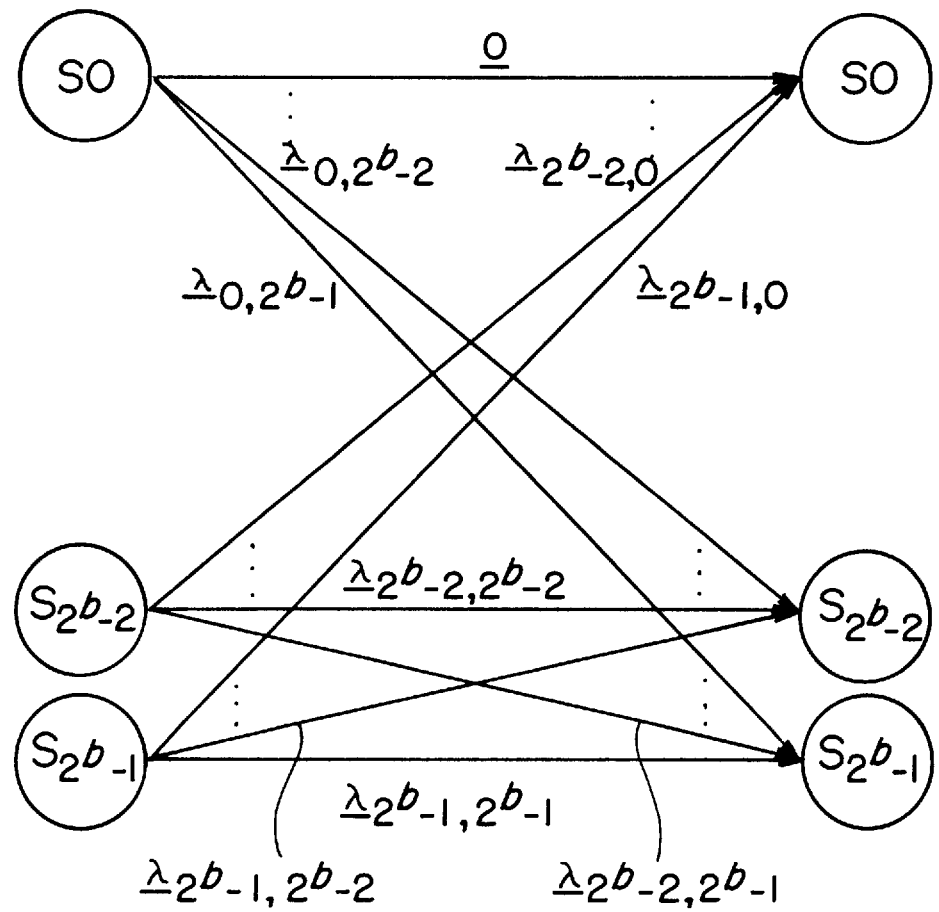
FIG. 4 illustrates a trellis structure for the embodiment of FIG. 3.

The simplest acceptable coset-selecting trellis or convolutional code with b inputs uses the minimum number of delay elements, namely one delay element per bit of the first portion of the input digital word. Such an encoder is illustrated in FIG. 3 and its trellis is illustrated in FIG. 4. In FIG. 3, components corresponding to components of FIG. 1 have the same reference number but with a prime. In the encoder in FIG. 3, the subcode-selecting trellis code unit 11' comprises a trellis encoder 12 and the block code unit 10' comprises a selector in the form of a 1—1 mapping device 14, such as a memory, look-up table or other suitable device, having 2b inputs in two equal groups. The first group, identified as inputs $16_1$ to $16_b$ are connected directly to inputs ports $18_1$ to $18_b$ of the encoder to receive the first group of b bits. The second group, identified as inputs 20$_1$ to 20$b$ are connected to inputs ports $18_1$ to $18_b$ by way of a corresponding set of b delay elements $22_1$ to $22_b$ to receive the b inputs of the encoder. Each delay is equivalent to the duration of the digital word to be encoded, i.e. m+b+1 bit periods. This set of delay elements $22_1$ to $22_b$, and the connections between the mapping device 14 and the input ports, constitute a simple convolutional encoder 12.

Each 2b bit word input to the mapping device 14 comprises the instant b bits and the preceding b bits, which the mapping device 14 maps to a corresponding coset leader. Thus, 0 . . . 0, 0 . . . 0 maps to $\lambda_{11}$; 0 . . . 0, 1 . . . 1 maps to $\lambda_{12^b}$; 1 . . . 1, 0 . . . 0 maps to $\lambda_{2^b 1}$; and so on, until 1 . . . 1, 1 . . . 1 maps to $\lambda_{2^b 2^b}$.

The block code unit 10' comprises also a Reed-Muller encoder 24 and a binary (modulo-2 addition) vector summing device 26. The latter has its two inputs connected to the output of the Reed-Muller encoder 24 and the output of the mapping device 14, respectively. Each coset leader output from the mapping device 14 comprises $2^m$ bits which the summing device 26 sums with the corresponding word output from the Reed-Muller encoder 24 to produce the codeword which is the output of the encoder. As indicated in FIG. 3, this would typically be sent to a modulator for modulation and transmission—if the encoder is being used in, say, a DS-CDMA cellular telephone system.

It should be noted that all of the coset leaders $+e, rar \lambda + ee_{i,j}$ are distinct. Since the Kerdock code is made up of $2^{m-1}$ cosets of the first-order Reed-Muller code, each having $2^{m+1}$ elements, the maximal value of b is $$b_{max} = \frac{m}{2} - 1.$$

Correspondingly, the coding rate is $$\frac{m+b+1}{2^m}$$

for a maximum of $$\frac{3m}{2^{m+1}}.$$

It should also be noted that the encoder of FIG. 3 requires exactly $2^{2b}$ coset leaders, which is half the number of available coset leaders. The trellis for $2^b$ states is illustrated in FIG. 4 and is self-explanatory.

Figure 5:
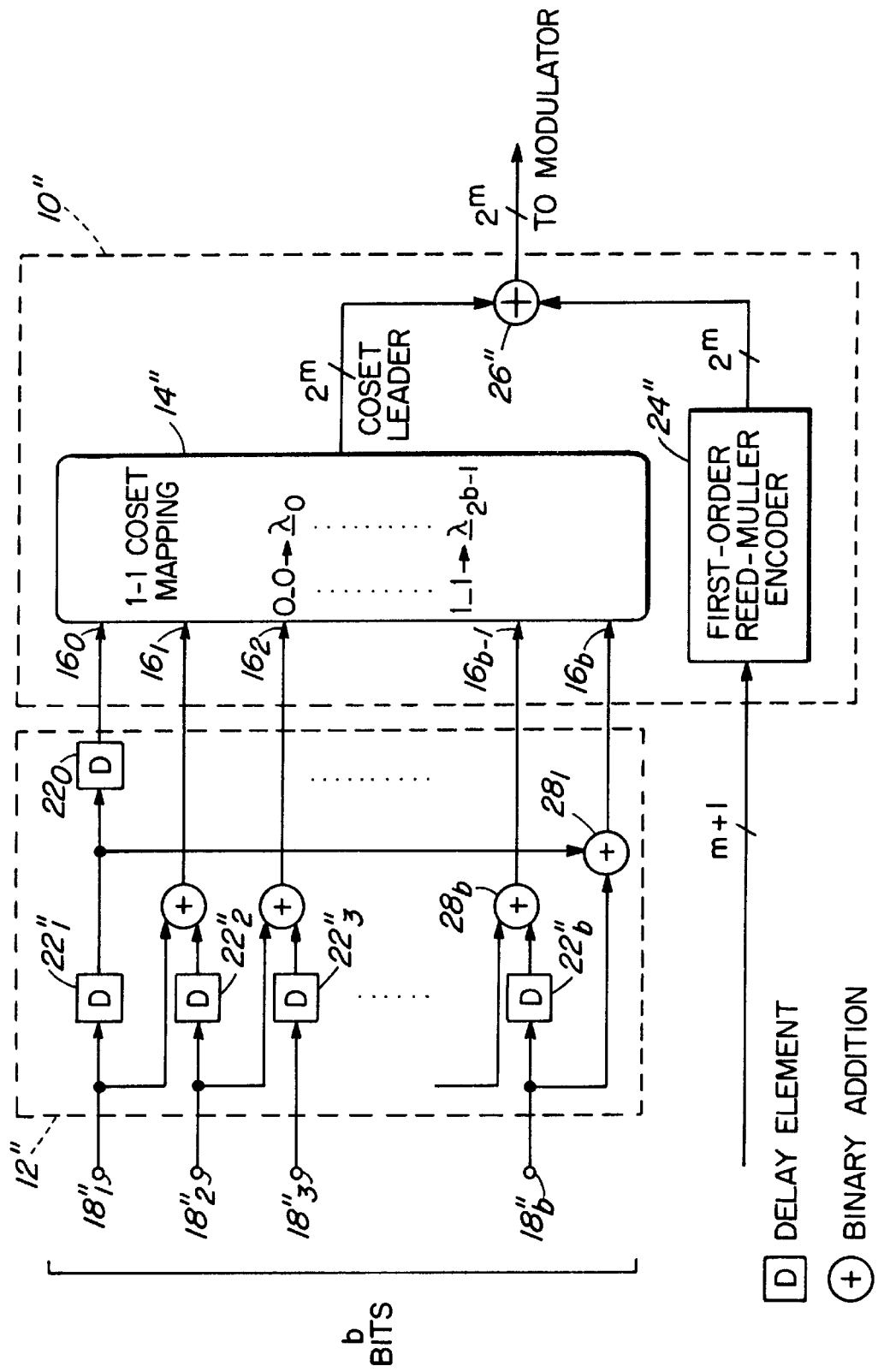
FIG. 5 is a block schematic representation of a second embodiment of an encoder according to the invention.

An alternative, preferred embodiment of encoder illustrated in FIG. 5 has a constraint length slightly larger than that of the encoder illustrated in FIG. 3. In FIG. 5, components corresponding to those of FIG. 1 or FIG. 3 have the same reference numerals but with a double prime. In the encoder of FIG. 5, the subcode-selecting trellis code unit 11" comprises trellis encoder 12" and block code unit 10" comprises a mapping device 14", the latter comprising, as before, a memory, look-up table or other suitable device. Trellis encoder 12" comprises a set of delays $22_0"$ to $22_b"$ and summing devices $28_1$ to $28_b$. The mapping device 14" has b+1 inputs identified as $16_0"$ to $16_b"$. The encoder has a set of b input ports identified as $18_1"$ to $18_b"$. Input port $18_1"$ is coupled to input $16_0"$ of the mapping device 14" by way of two delay elements $22_1"$ and $22_0"$ in series. Second input port $18_2"$ is connected to a second delay element $22_2"$, the output of which is connected to a modulo-2 summing device $28_2$ which sums the instant bit from port $18_1"$ with the delayed bit from port $18_2"$ and applies the sum to input $16_1"$ of mapping device 14". Likewise, input port $18_3"$ is connected to a third delay element $22_3"$, the output of which is connected to one input of a modulo-2 summing device $28_3$, the other input of which is connected to input port $18_2"$. The summing device $28_3$ sums the instant bit from port $18_2"$ and delayed bit from port $18_3"$ and applies the sum to input $16_2"$ of mapping device 14". The other input ports and delay elements are connected in a similar manner. The final input port $18_b"$ is coupled to delay element $22_b"$, the output of which is connected to summing device $28_b$ the other input of which is connected to the preceding encoder input port (not shown) and the output of which is connected to input $16_{b-1}"$ of mapping device 14". Final input port $18_b"$ is also coupled to one input of a summing device $28_1$, the other input of which is connected to the output of delay element $22_1"$. The output of summing device $28_1$ is applied to the last input $16_b"$ of mapping device 14".

As depicted in FIG. 5, the mapping device 14" maps the first trellis-encoded word 0 . . . 0 to coset leader $\lambda_0$ and so on, the final trellis encoded word 1 . . . 1 mapping to $\lambda$hd $2_{b+1}-_1$.

The output of the mapping device 14" and the output of the Reed-Muller encoder 24" are connected to respective inputs of binary vector summing means 28". The output of the binary vector summing means 28" is the codeword of $2^m$ bits for output from the encoder. The Reed-Muller encoder 24" is the same as the Reed-Muller encoder 24 of FIG. 3 and encodes the second group of m+1 bits of the digital word at the input.

The coset-selecting trellis code of the encoder of FIG. 5 has a modified free distance $d_{mf}$ equal to 2. The coding rate is $$\frac{m+b+1}{2^m}$$

for a maximum of $$\frac{m-1}{2^m}.$$

Indeed, since there are at most $2^{m-1}$ distinct coset leaders which must be indexed by the b+1 outputs of the trellis code unit, it follows that $b_{max}=m-2$.

When each group of parallel branches is a coset of the same base block code (e.g. cosets of the first-order Reed-Muller block code), the decoding is significantly simplified, since the same processing can be applied to the different coset codes after pre-multiplication by the appropriate coset leader. The code structure is enriched, since different cosets of the same subcode are essentially "translations" of each other and have the same distance properties. The partitioning of the Kerdock code into its first-order Reed-Muller cosets is a particularly well-suited example since the Fast Hadamard Transform (FHT) can be used to compute the branch metrics in the Viterbi decoding algorithm efficiently.

In a typical CDMA receiver or the like, the signal comprising the sequence of codewords would also include transmission noise. It would be demodulated to produce a sequence of received vectors, each having a plurality of elements corresponding to the plurality of bits of the encoded codeword. The received vectors would be applied to a decoder. A decoder suitable for decoding received vectors corresponding to the codewords output from either of the embodiments of FIGS. 1 and 3 will now be described with reference to FIG. 6.

Figure 6:
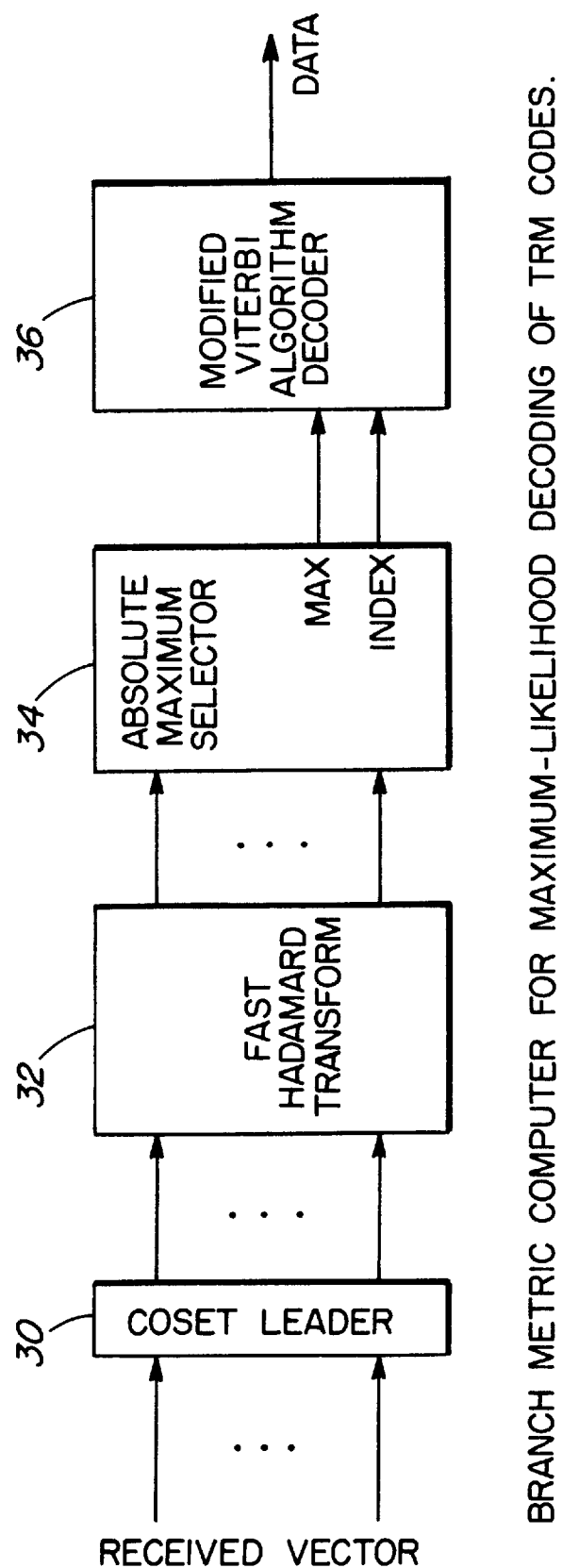
FIG. 6 is a block schematic representation of a decoder for decoding the code words from either embodiment of encoder to determine the original digital word.

The decoder shown in FIG. 6 comprises a coset leader "sign multiplication" unit 30, a block decoder in the form of a Fast Hadamard Transform unit 32, an Absolute Maximum Selector 34 and a convolutional decoder in the form of a modified Viterbi Algorithm Decoder 36. The Absolute Maximum Selector 34 determines the element of each input vector having the largest absolute value and outputs that value (signed) together with a corresponding index which represents the group of m+1 bits which was most likely to have been applied to the corresponding block encoder to select the codeword from the selected coset, in the event that the correct coset is assumed in coset leader block 30". The modified Viterbi algorithm decoder 36 then selects exactly one codeword on the trellis branch together with its associated likelihood metric. The decoder will accumulate data for the entire sequence of received vectors and then be reset, whereupon it will output an estimate of the most likely trellis path and hence the most likely series of codewords which were received. The cycle will then repeat for another series of codewords.

The decoder comprises a vector "addition" unit 30 which applies to each received vector, in succession, all of the coset leaders, any one of which the subcode selector 14 might have used to select the subcode or coset for use in encoding that particular first group of m+1 bits. Where the coset leader bit is a "1", the vector addition unit 30 changes the sign of the corresponding element of the received vector and, where the coset leader bit is "0", leaves the sign of the received vector element unchanged.

The Fast Hadamard Transform is an efficient method of decoding first-order Reed-Muller codes. The Fast Hadamard Transform unit 32 produces a corresponding vector. The Absolute Maximum Selector 34 selects the maximum absolute value, which might be positive or negative, and supplies it (signed) as a metric to the modified Viterbi decoder 34. For each particular magnitude and sign, the Absolute Maximum Selector 28 produces an index, representing the corresponding m+1 bits input to the Reed-Muller encoder 24/24" to encode the corresponding word, and supplies it with the metric to the modified Viterbi algorithm decoder 36. The index is determined by the position of the maximum absolute value in the input codeword vector. In essence, whenever the correct coset is assumed, the index represents the most likely m+1 bit word fed into the Reed-Muller encoder 24/24".

The modified Viterbi Algorithm decoder 36 determines the trellis path. Usually, a Viterbi algorithm decoder is assumed to produce its own metrics. The modified Viterbi Algorithm Decoder 36, however, is modified to operate upon metrics which are supplied to it by the Absolute Maximum detector 34. It is also modified to enable it to associate the metrics with their corresponding indexes. This simply entails additional storage space for the indexes, i.e. storage for m+1-bit indexes associated with the usual memory for the metrics. Otherwise, the Viterbi Algorithm decoder 36 is of conventional form and so will not be described in detail. For more details of such Viterbi algorithm decoders, the reader is directed to the article "Viterbi Decoding for Satellite and Space Communication", IEEE Transactions on Communication Technology, Vol. COM-19, No. 5, October 1971, Heller et al, which is incorporated herein by reference.

The modified Viterbi Algorithm decoder 36 will process the metrics for each of the coset leaders for each of the predetermined number of received vectors, to determine the state transitions of the trellis code unit 12 and map them to the corresponding sequence of b bit words input to the trellis code unit 12 (FIG. 1). Each state transition is associated with a metric and hence with one of the indexes stored in the modified Viterbi Algorithm decoder 36 in association with that metric. Consequently, the modified Viterbi Algorithm decoder associates the codewords for the different state transitions with their respective indexes and outputs the "most likely" sequence of b+m+1 bit digital words which were originally encoded. The cycle is then repeated for another sequence of received codeword vectors.

It should be appreciated that the coset addition unit 30, Fast Hadamard Transform unit 32 and Absolute Maximum Selector 34 will run at a rate which is a multiple of the rate at which the codeword vectors are received. In the specific embodiment, the multiple is $2^{m-1}$ times. If preferred, however, a form of parallel processing could be used, in which case each of the parallel branches would have a coset addition unit 24, a Fast Hadamard Transform unit 26 and an Absolute Maximum Selector 28. Each branch would add a different one of the possible coset leaders.

There is more than one state transition for each associated coset leader. Obviously, the corresponding branches need only one branch metric computer. For a particular trellis stage, the same coset leader might be associated with two distinct state transitions. For example, S0→S2 and S3→S7 might have the same coset associated with them. In the decoding process, there is no need to repeat the process "coset leader addition+FHT+Absolute maximum selection" because the result is the same. Furthermore, the high parallelism between different branch metric computers can be exploited to reduce the decoding complexity by using common intermediate results between Fast Hadamard Transforms. On the other hand, if the transmission rate is not too large, a single branch metric computer is sufficient; the same Fast Hadamard Transform and Absolute Maximum Selector blocks are used repetitively with varying coset leaders in the coset leader block. Finally, hard-decision decoding is straightforward to implement, and can reduce significantly the complexity of the Fast Hadamard Transform block at the cost of suboptimum decoding.

Embodiments of the invention are especially useful for cellular radio systems for providing increased system capacity. Nevertheless, it should be appreciated that the invention is not limited to cellular radio systems or CDMA communication systems but could be applied to other systems in which digital signals are required to be encoded for transmission and/or storage, for example, in deep space communications systems.

Embodiments of the present invention permit the use of long block codes that are rich in structure to be used jointly with a coset-selecting trellis code. This is particularly advantageous for multiple-access communications systems, particularly indoor and mobile communications systems which utilize spread-spectrum multiple access schemes, because the bandwidth of the signal of a given user is much larger than the data rate of that user.

Although the main block code described herein is a Kerdock code, it should be appreciated that other codes might be used, provided they can be partitioned into subcodes with good distance properties; for example, the second-order Reed-Muller code partitioned into cosets of the first-order Reel-Muller code. Although the preferred embodiments described herein use cosets of the main block code, it would be possible to use other subcodes of a large block code instead.

It should be noted that the b bits are protected to a greater extent than the m+1 bits from errors caused by channel perturbation. This may be exploited to advantage in certain applications, for example speech encoding.

Although embodiments of the invention have been described and illustrated in detail, it is to be clearly understood that the same is by way of illustration and example only and not to be taken by way of the limitation, the spirit and scope of the present invention being limited only by the appended claims.

What is claimed is:

1. A method of encoding a digital signal comprising a sequence of digital words, each comprising a first portion and a second portion, to provide a corresponding sequence of codewords, supplying the sequence of codewords to a transmission or storage medium, extracting a corresponding sequence of codeword vectors from the transmission or storage medium, and decoding the sequence of codeword vectors to extract the originally-encoded sequence of digital words;

the encoding comprising the sequential steps of:

using a trellis code, successively encoding respective first portions of the sequence of digital words to produce a corresponding sequence of trellis-encoded words, each of the trellis-encoded words corresponding, in the sequence, to one of the digital words;

and encoding each second portion of the digital words using one of a plurality of subcodes of a block code, each subcode comprising a coset of a Reed-Muller code, the coset used for a particular second portion being determined by the trellis-encoded word obtained by encoding the corresponding first portion;

the decoding comprising the steps of;

operating upon each of the codeword vectors using a decoder for each of the subcodes to produce, for each subcode, an estimated decoded second portion and a metric representing the likelihood that the estimated decoded second portion is correct, given that the assumed subcode is correct;

using a trellis decoder, operating upon the sequence of likelihood metrics and the associated estimated second portions to provide a sequence of estimated first portions; and associating with each of the estimated first portions the corresponding estimated second portion thereby providing a sequence of output digital words corresponding to the sequence of digital words originally encoded.

2. A method as claimed in claim 1, wherein the trellis code is a convolutional code.

3. A method as claimed in claim 1, wherein the block code comprises a Kerdock code partitioned into said cosets of a Reed-Muller code.

4. A method as claimed in claim 1, wherein the second portions are encoded by operating upon each second portion using a Reed-Muller code and adding to each Reed-Muller encoded word a coset leader, the coset leaders being selected by mapping the trellis-encoded words to respective coset leaders of the Reed-Muller code.

5. A method as claimed in claim 1, wherein the step of encoding each second portion comprises the steps of using the trellis encoded word to select one of the cosets of the Reed-Muller code and using the selected coset to operate upon the second portion.

6. A method as claimed in claim 1, wherein the decoding is performed using a Fast Hadamard Transform for each subcode and the trellis decoder uses a Viterbi algorithm.

7. A method of encoding a digital signal comprising a sequence of digital words, each comprising a first portion and a second portion, to provide a corresponding sequence of codewords, comprising the sequential steps of:

using a trellis code, successively encoding respective first portions of the sequence of digital words to produce a corresponding sequence of trellis encoded words, each of the trellis-encoded words corresponding, in the sequence, to one of the digital words;

and encoding each second portion of the digital words using one of a plurality of subcodes of a block code, each subcode comprising a coset of a Reed-Muller code, the coset used for a particular second portion being determined by the trellis-encoded word obtained by encoding the corresponding first portion.

8. A method as claimed in claim 7, wherein the trellis code is a convolutional code.

9. A method as claimed in claim 7, wherein the block code comprises a Kerdock code partitioned into said cosets of a Reed-Muller code.

10. A method as claimed in claim 7, wherein the second portions are encoded by operating upon each second portion using a Reed-Muller code and adding to each Reed-Muller encoded word a coset leader, the coset leaders being selected by mapping the trellis-encoded words to respective coset leaders of the Reed-Muller code.

11. A method as claimed in claim 7, wherein the step of encoding each second portion comprises the steps of using the trellis-encoded word to select one of the cosets of the Reed-Muller code and using the selected coset to operate upon the second portion.

12. A method as claimed in claim 7, wherein the decoding is performed using a Fast Hadamard Transform for each subcode and the trellis decoder uses a Viterbi algorithm.

13. A method of decoding a sequence of codeword vectors formed by encoding a sequence of digital words, each having a first portion and a second portion, by the sequential steps of, using a trellis code, successively encoding respective first portions of the sequence of digital words to produce a corresponding sequence of trellis-encoded words, each of the trellis-encoded words corresponding, in the sequence, to one of the digital words, using each trellis-encoded word to select a corresponding one of a plurality of subcodes of a block code each comprising a coset of a Reed-Muller code, and using the selected subcode to encode the second portion of the corresponding digital word;

the method of decoding comprising the steps of:

operating upon each of the codeword vectors using a decoder for each of the subcodes to produce, for each subcode, an estimated decoded second portion and a metric representing the likelihood that the estimated decoded second portion is correct, given that the assumed subcode is correct;

using a trellis decoder, operating upon the sequence of likelihood metrics and the associated estimated second portions to provide a sequence of estimated first portions;

and associating with each of the estimated first portions the corresponding estimated second portion thereby providing a sequence of output digital words corresponding to the sequence of digital words originally encoded, wherein the step of operating upon each of the codeword vectors includes the steps of applying to each codeword vector a coset leader for each of the cosets, and performing a Fast Hadamard Transform upon the resulting vector, and the step of operating upon the sequence of likelihood metrics and associated estimated second portions comprises applying a Viterbi algorithm thereto.

14. Apparatus for encoding a digital signal comprising a sequence of digital words, each comprising a first portion and a second portion, to provide a corresponding sequence of codewords, supplying the sequence of codewords to a transmission or storage medium, extracting a corresponding sequence of codeword vectors from the transmission or storage medium, and decoding the sequence of codeword vectors to extract the originally-encoded sequence of digital words;

the apparatus comprising an encoder comprising:

a trellis code unit for successively encoding respective first portions of the sequence of digital words to produce a corresponding sequence of trellis-encoded words, each of the trellis-encoded words corresponding, in the sequence, to one of the digital words;

a block code unit responsive to the trellis-encoded words for encoding respective second portions of the digital words to provide codewords from selected ones of subcodes of the block code, each subcode comprising a coset of a Reed-Muller code, the coset used for a particular second portion being determined by the trellis-encoded word obtained by encoding the corresponding first portion;

the apparatus further comprising a decoding unit comprising;

means for operating upon each of the sequence of codeword vectors using a decoder for each of the subcodes to produce, for each subcode, an estimated decoded second portion and a metric representing the likelihood that the estimated decoded second portion is correct, given that the assumed subcode is correct;

a trellis decoder unit having means for operating upon the sequence of likelihood metrics and the associated estimated second portions to provide a sequence of estimated first portions;

and means for associating with each of the estimated first portions the corresponding estimated second portion thereby to provide a sequence of output digital words corresponding to the sequence of digital words originally encoded.

15. Apparatus as claimed in claim 14, wherein the trellis code unit comprises a plurality of input ports corresponding to the bits of said first portion of the digital signal, each for receiving a respective one of said bits, a corresponding plurality of delay elements each having an input connected to a respective one of the plurality of input ports, a plurality of summing devices each having a first input connected to an output of a respective one of the plurality of delay elements and an output connected to a respective one of a corresponding plurality of inputs of the selector means, the one of said plurality of delay elements connected to the first of the input ports having its output connected to a second input of the one of said summing devices having its first input connected to the last of the input ports and, by way of a further delay element, to a further input of the selector means preceding its plurality of inputs, each of the delay elements having a delay substantially equal to the duration of a said digital word.

16. Apparatus as claimed in claim 14, wherein the block code unit comprises a Reed-Muller encoder for encircling the second portions of the digital words to provide a sequence of Reed-Muller encoded words, selector means for mapping the trellis-encoded words to coset leaders of cosets of the Reed-Muller code, and a summing device for summing each coset leader with the corresponding Reed-Muller encoded word to provide said codeword.

17. Apparatus as claimed in claim 16, wherein the trellis decoder comprises a Viterbi algorithm decoder.

18. Apparatus as claimed in claim 14, wherein the block code unit comprises means responsive to the trellis-encoded word for selecting one of said cosets of the Reed-Muller code and using the selected coset to operate upon the corresponding second portion.

19. Apparatus as claimed in claim 14, wherein, in the decoding unit, the means for operating upon each of the sequence of codeword vectors comprises means for combining with each codeword vector each of the coset leaders and Fast Hadamard Transform means for operating upon the vectors resulting from such combination to produce said estimated decoded second portion and the metric representing the likelihood that the estimated decoded second portion is correct, given that the assumed subcode is correct.

20. Apparatus for encoding a digital signal comprising a sequence of digital words, each comprising a first portion and a second portion, to provide a corresponding sequence of codewords, comprising:

a trellis code unit for successively encoding respective first portions of the sequence of digital words to produce a corresponding sequence of trellis encoded words, each of the trellis-encoded words corresponding, in the sequence, to one of the digital words; and a block code unit for encoding respective second portions of the digital words to provide codewords from the selected ones of subcodes of the block code, the block code unit using one of a plurality of subcodes of a block code, each subcode comprising a coset of a Reed- Muller code, the coset used for a particular second portion being determined by the trellis-encoded word obtained by encoding the corresponding first portion.

21. Apparatus as claimed in claim 20, wherein the block code unit comprises a Reed-Muller encoder for encoding the second portions of the digital words to provide a sequence of Reed-Muller encoded words, selector means for mapping the trellis-encoded words to coset leaders of cosets of the Reed-Muller code, and a summing device for summing each coset leader with the corresponding Reed-Muller encoded word to provide said codeword.

22. Apparatus as claimed in claim 20, wherein the trellis encoder comprises a plurality of input ports and a corresponding plurality of delay elements equal in number to the number of bits in said first portion, each delay element having a delay equal to the duration of a said digital word, the input ports being connected directly to a first set of inputs of the selector unit and via the delay elements to a second set of inputs of the selector unit.

23. Apparatus as claimed in claim 20, wherein the trellis encoder comprises a plurality of input ports corresponding to the bits of said first portion of the digital signal, each for receiving a respective one of said bits, a corresponding plurality of delay elements each having an input connected to a respective one of the plurality of input ports, a plurality of summing devices each having a first input connected to an output of a respective one of the plurality of delay elements and an output connected to a respective one of a corresponding plurality of inputs of the selector means, the one of said plurality of delay elements connected to the first of the input ports having its output connected to a second input of the one of said summing devices having its first input connected to the last of the input ports and, by way of a further delay element, to a further input of the selector means preceding its plurality of inputs, each of the delay elements having a delay substantially equal to the duration of a said digital word.

24. Apparatus as claimed in claim 20, wherein the block code unit comprises means responsive to the trellis-encoded word for selecting one of said cosets of the Reed-Muller code and using the selected coset to operate upon the corresponding second portion.

25. A decoding apparatus for decoding codeword vectors produced by encoding a digital signal comprising a sequence of digital words, each comprising a first portion and a second portion, to provide a corresponding sequence of codewords, the sequence of codewords being supplied to a transmission or storage medium, and extracted as a corresponding sequence of codeword vectors from the transmission or storage medium, the codewords being encoded by, using a trellis code, successively encoding respective first portions of the sequence of digital words to produce a corresponding sequence of trellis-encoded words, each of the trellis-encoded words corresponding, in the sequence, to one of the digital words; using each trellis-encoded word to select a corresponding one a plurality of subcodes of a block code; and using the selected subcode to encode the second portion of the corresponding digital word, the block code comprising subcodes each constituted by one of a plurality of cosets of a Reed-Muller code; the decoding unit comprising;

means for operating upon each of the codeword vectors using a decoder for each of the subcodes to produce, for each subcode, an estimated decoded second portion and a metric representing the likelihood that the estimated decoded second portion is correct, given that the assumed subcode is correct, the decoder using a Fast Hadamard Transform;

a trellis decoder unit having means using a Viterbi algorithm for operating upon the sequence of likelihood metrics and the associated estimated second portions to provide a sequence of estimated first portions; and means for associating with each of the estimated first portions the corresponding estimated second portion thereby to provide a sequence of output digital words corresponding to the sequence of digital words originally encoded.

26. A decoding apparatus as claimed in claim 25, said second portions having been encoded by operating upon each second portion using the selected coset of the Reed-Muller code and adding to each Reed-Muller encoded word a coset leader, the coset leaders being selected by mapping the trellis-encoded words to respective coset leaders of the Reed-Muller code, wherein the means for operating upon each of the codeword vectors comprises means for combining with each codeword vector each of the coset leaders and Fast Hadamard Transform means for operating upon the vectors resulting from such combination to produce said estimated decoded second portion and said metric.

* * * * *